(12) United States Patent
Bierer

(10) Patent No.: US 6,753,678 B2
(45) Date of Patent: Jun. 22, 2004

(54) VOLTAGE DETECTOR WITH IMPROVED ACCURACY

(76) Inventor: Walter S. Bierer, 183 Elton Walker Rd., Blythewood, SC (US) 29016

( * ) Notice: Subject to any disclaimer, the term of this patent is extended or adjusted under 35 U.S.C. 154(b) by 0 days.

(21) Appl. No.: 10/263,597

(22) Filed: Oct. 3, 2002

(65) Prior Publication Data

US 2003/0067295 A1 Apr. 10, 2003

Related U.S. Application Data

(60) Provisional application No. 60/327,481, filed on Oct. 5, 2001.

(51) Int. Cl.[7] ............................................... G01R 21/00
(52) U.S. Cl. ....................... 324/141; 324/142; 324/765; 324/158.1
(58) Field of Search ............................. 324/158.1, 142, 324/141, 113, 114, 115, 116, 103 R, 126, 127; 702/60, 61, 62, 104; 340/825.07

(56) References Cited

U.S. PATENT DOCUMENTS

| | | | | |
|---|---|---|---|---|
| 3,970,925 A | * | 7/1976 | Procter et al. | ............... 324/649 |
| 4,316,254 A | * | 2/1982 | Levin | ........................... 702/72 |
| 5,517,106 A | * | 5/1996 | Longini | ....................... 324/142 |
| 2003/0042886 A1 | * | 3/2003 | Gandhi | ........................ 324/142 |

* cited by examiner

Primary Examiner—Kamand Cuneo
Assistant Examiner—Jimmy Nguyen
(74) Attorney, Agent, or Firm—Michael A. Mann; Nexsen Pruet Adams Kleemeier LLC

(57) ABSTRACT

The present invention is a voltage detector that is capable of measuring AC voltages, especially the high voltages encountered by electric utility linemen, with improved accuracy. To obtain these improvements in accuracy the present invention includes a novel circuit, which can be incorporated into a standard digital voltage detector. This circuit is able to accurately determine the magnitude of external capacitive reactance, which allows the voltage detector to compensate for variances in the external capacitive reactance that, if uncompensated, could adversely affect the voltage measurement; consequently, this invention provides the user with an AC voltage detector having improved accuracy characteristics.

9 Claims, 4 Drawing Sheets

VOLTAGE DETECTOR WITH IMPROVED ACCURACY

CROSS REFERENCE TO RELATED APPLICATIONS

This application claims the benefit of U.S. Provisional Application No. 60/327,481, filed on Oct. 5, 2001, which is incorporated herein by reference. Applicant claims the priority date benefits of that application.

STATEMENT REGARDING FEDERALLY SPONSORED RESEARCH OR DEVELOPMENT

Not applicable.

BACKGROUND OF THE INVENTION

The present invention relates to a high voltage measuring device and, more particularly, to a high voltage detector that can be used for measuring voltages in high voltage AC circuits or systems with improved accuracy.

Voltage detectors are a form of voltmeter that measure voltages without the use of a ground lead. Typically voltage detectors are used for measuring high alternating current ("AC") voltages such as those encountered by electrical power utility linemen. To make measurements, voltage detector designers know that they need to determine the magnitude of the alternating current flowing through the voltage detector, and they also know that the magnitude of the alternating current being measured is a function of three things: (1) the internal impedance of the device, which is a known quantity; (2) the external capacitive reactance between the device and electrical ground; and (3) the magnitude of the voltage source being measured, e.g., the voltage carried through a high voltage conductor. To be able to determine the unknown voltage magnitude, the detector designers need to determine or assume a value for the external capacitive reactance. To the best of Applicant's knowledge, all voltage detectors manufactured today assume a nominal value for the external capacitive reactance, which results in the detector providing a nominal voltage reading based on the capacitive reactance value assumed. However, since external capacitive reactance is a variable that is based on the many conditions under which the detector may be used, e.g., the external capacitive reactance is greatly affected by the height of the detector above ground, this assumed value for external capacitive reactance can cause an accuracy problem, i.e., the voltage measurements taken will be in error whenever the external capacitive reactance is above or below the assumed value.

SUMMARY OF THE INVENTION

According to its major aspects and broadly stated, the present invention is a voltage detector that is capable of measuring AC voltages with improved accuracy. To obtain these improvements in accuracy the present invention includes a novel circuit, which can be incorporated into a standard digital type voltage detector. Instead of relying on an assumed, i.e., fixed, external capacitive reactance value, which will lead to AC voltage measurement errors whenever the actual external capacitive reactance differs from the assumed value, this detector is designed to determine the phase angle difference between the applied voltage, e.g., the electrical transmission line voltage being measured, and the resulting current in an alternating current system.

Generally stated, in a purely resistive AC circuit the phase angle difference between the voltage and current waveforms is zero degrees (0°); in a purely capacitive AC circuit the phase angle difference between the voltage and current waveforms will be ninety degrees (90°), with the current waveform leading the voltage waveform by this angular amount; and, in a combination resistive-capacitive circuit, the phase angle difference will be in the range between 0° and 90°. By using this phase angle difference concept, i.e, that the phase angle between the voltage and current waveforms is a function of the impedance characteristics of the circuit or system, the present invention is able to determine the actual value of the external capacitive reactance instead of relying on an assumed value for this characteristic and, therefore, is able to provide voltage measurements with improved accuracy by compensating for the variances in the magnitudes of the external capacitive reactance from measurement to measurement.

A major advantage of the present invention is that its design can be used, and/or modified, to measure AC voltages with improved accuracy over a wide range of magnitudes.

Another advantage of the present invention is that the simplicity of design of the novel circuit allows the circuit to be substituted and, therefore, used in a wide variety of meter configurations.

These and other features and their advantages will be apparent to those skilled in the art of from a careful reading of the Detailed Description of a Preferred Embodiments accompanied by the drawings.

BRIEF DESCRIPTION OF THE DRAWINGS

In the figures.

DETAILED DESCRIPTION OF THE PREFERRED EMBODIMENTS

Figure 1:
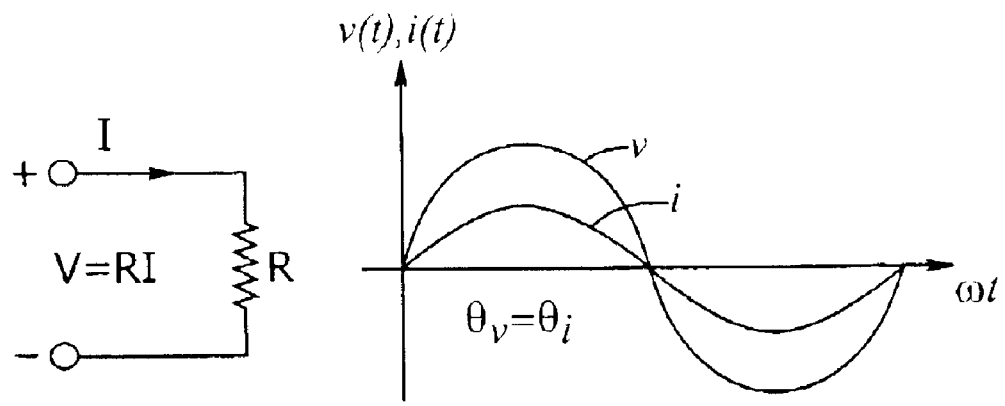
FIG. 1 is a diagram of a purely resistive AC circuit having a 60 Hertz voltage source and a resistive load, and the resultant voltage and current waveforms measured relative to the load.

Referring to the drawings, the present invention is a voltage detector having improved AC circuit voltage measurement accuracy. The voltage detector, is generally referred to by reference number 10 and the novel detector circuit is generally referred to by reference number 20.

Figure 2:
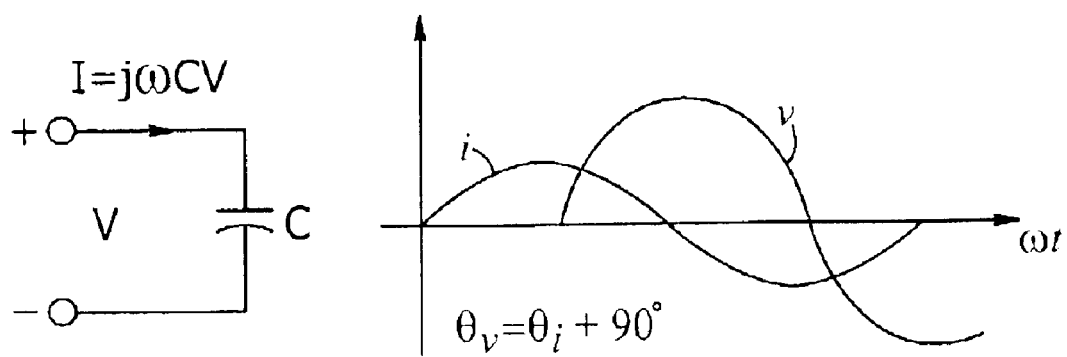
FIG. 2 is a diagram of a purely capacitive AC circuit having a 60 Hertz voltage source and a capacitive load, and the resultant voltage and current waveforms measured relative to the load.

Referring now to FIGS. 1–3, representations of typical AC circuits and their associated voltage and current waveforms are shown. It is well known that in a purely resistive AC circuit the resultant voltage and current waveforms are "in-phase" with each other or, in other words, the phase angle difference between the two waveforms is zero degrees (0°) (as shown in FIG. 1). In the purely capacitive AC circuit the current waveform leads the voltage waveform and the phase angle difference between the two waveforms is ninety degrees (90°) or, in other words, the waveforms are "out-of-phase" by ninety degrees (90°) (as shown in FIG. 2). It is also well known that a combination resistive-capacitive AC circuit will have a phase angle difference in the range between 0° and 90°.

Figure 3A:
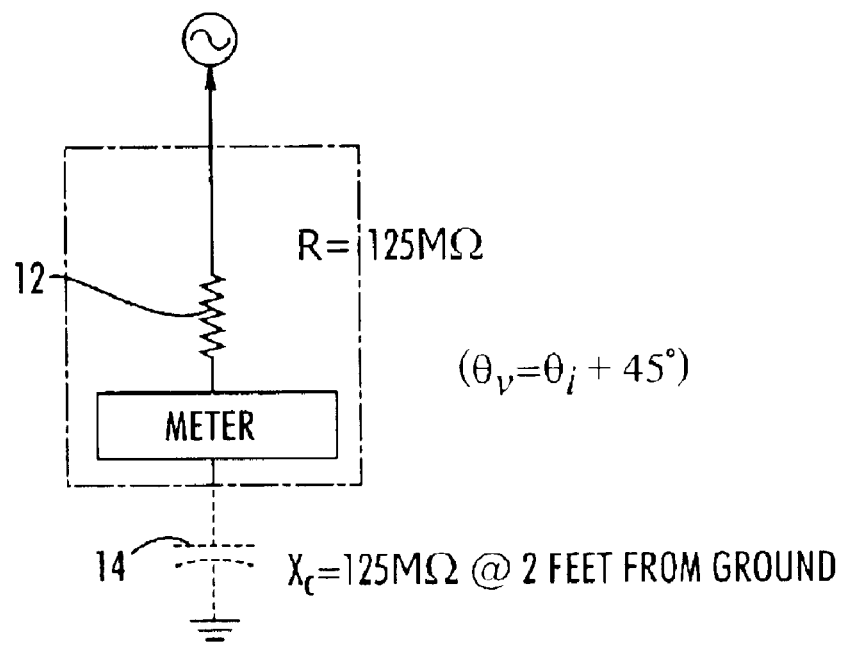
FIG. 3A is a diagram of a meter circuit having a known internal resistance and external capacitive reactance.
Figure 3B:
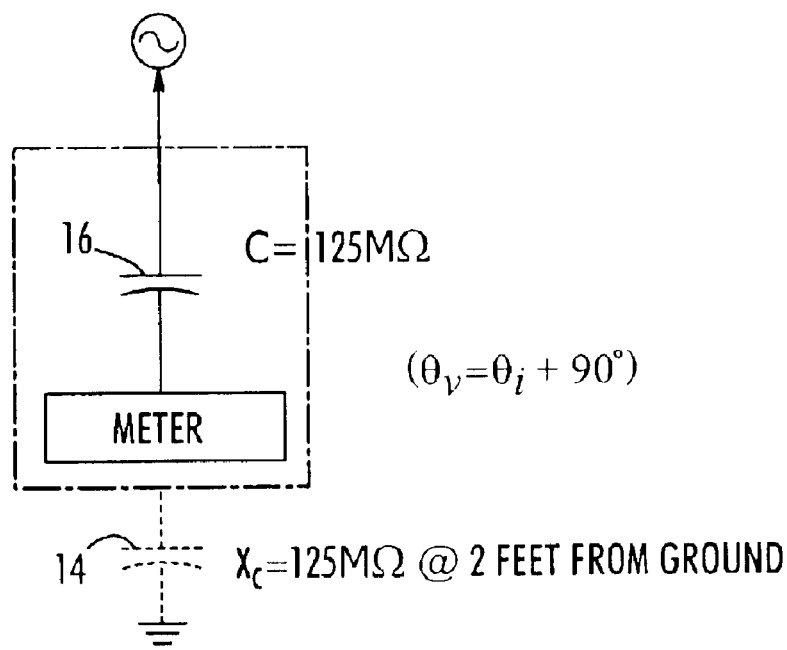
FIG. 3B is a diagram of a meter circuit having a known internal capacitive reactance and external capacitive reactance.

Referring now to FIGS. 3A and 3B, representations of typical meter circuits used for measuring AC circuit voltages are shown for illustrative purposes. In FIG. 3A, the magnitudes of the internal resistance 12 and the external capacitive reactance 14 are equal, which results in a forty-five degree (45°) phase angle difference between the applied voltage, e.g., the electrical transmission line voltage being measured, and the resulting current waveforms. In FIG. 3B, the internal resistance 12 is replaced with an internal capacitive reactance 16 of equal magnitude, which makes it equal in magnitude to the external capacitive reactance 14, and which results in a ninety degree (90°) phase angle difference between the applied voltage and the resulting current waveforms.

Figure 4A:
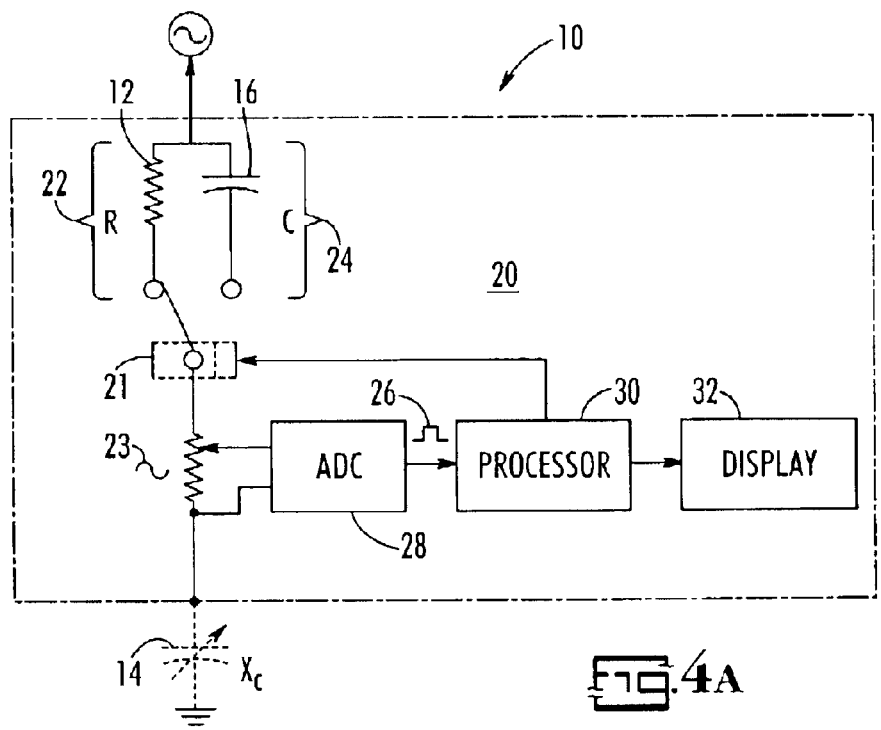
FIG. 4A is a diagram of the detector showing the internal resistance path signal being developed, according to a preferred embodiment of the present invention.
Figure 4B:
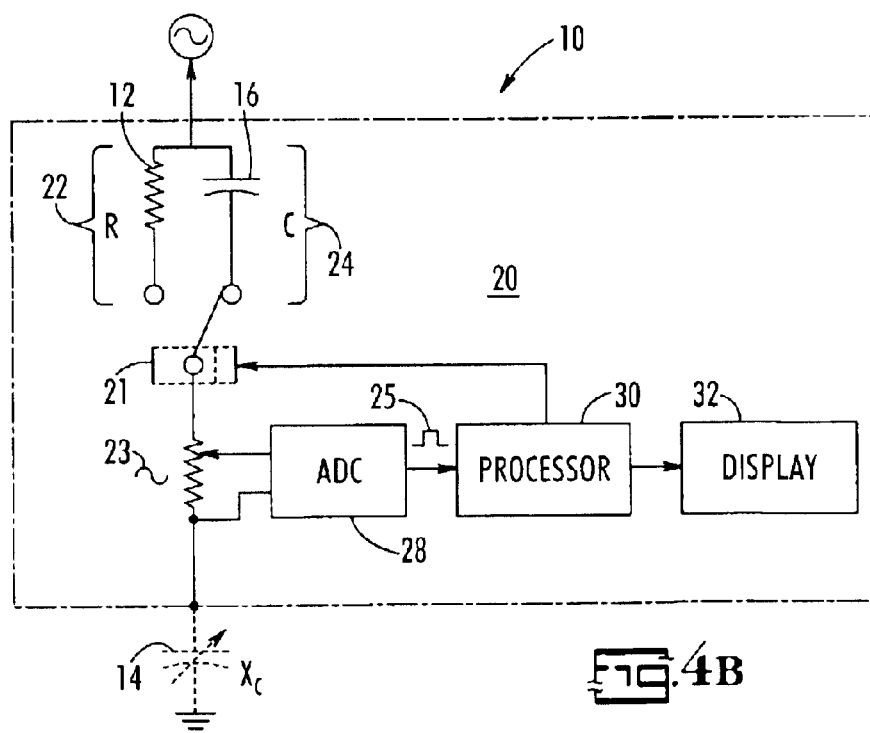
FIG. 4B is a diagram of the detector showing the internal capacitive reactance path signal being developed, according to a preferred embodiment of the present invention.

Based on this concept, by inserting a known internal capacitive reactance 16 into the detector circuit 20, as shown in FIG. 4B, a known phase angle difference between the applied voltage waveform and the resulting detector 10 current waveform of effectively ninety degrees (90°) will result. Relatedly, if the internal resistance 12 is substituted for the internal capacitive reactance 16 in the detector circuit 20, the phase shift differences between the applied voltage waveform and the resulting current through the detector 10 waveform will follow an exact relationship corresponding to the variances in the external capacitive reactance 14. Therefore, if the phase shift differences between the resulting current through the detector 10 waveforms can be determined for the above-described circuit changes then the external capacitive reactance 14 can likewise be determined based on these differences.

Referring now to FIGS. 4A and 4B, the present invention is a voltage detector 10 that is based on the foregoing principles. The detector 10 includes detector circuit 20. Preferably, the voltage detector 10, with the exception of the novel detector circuit 20, is a standard digital voltage detector capable of being used for measuring AC voltages, but the voltage detector 10 can be any other type of measuring instrument or device that would be suitable for measuring AC voltages. Since voltage detectors are well known in the art, and since the inventive concept of the present invention lies in the detector circuit 20 and its combination with the voltage detector 10, and not in the voltage detector 10 itself, with the exception of the novel detector circuit 20, the circuitry used in, and the fabrication and the operation of, the voltage detector 10 used in combination with the novel detector circuit 20 will not be described herein.

More specifically, the detector circuit 20 is a means for determining the phase angle difference between an applied voltage and the resulting current through the detector circuit 20 comprising: (1) a switching and sensing means 21, for switching between the internal resistance input path 22 and the internal capacitive reactance input path 24, and for sensing the analog current signal 23 through an input path (22 or 24), which is proportional to the voltage in the circuit being measured; (2) a high speed analog to digital converter 28 for converting an analog current flow signal 23 into a digital signal (25 or 26) for digital signal processing; (3) a computer processor 30, which is used to analyze the magnitude and phase of each voltage based on the digital signals (25 and 26), and to calculate and/or determine the external capacitive reactance 14 based on this analysis; and (4) a display means 32 for visually providing the improved accuracy measurement to a user.

After calculating and/or determining the external capacitive reactance 14, two of the parameters in an equation having three parameters are known, i.e., the internal impedance, which is either the magnitude of the internal resistance 12 or the internal capacitive reactance 16, and the external capacitive reactance 14. Consequently, it is mathematically possible to determine the unknown third parameter, e.g., the exact AC line voltage. The equations that can be used for determining the AC line voltage include, but are not limited to, the following:

Voltage$_{(ac)}$=Z$_{total}$*I; Z$_{total}$=(R$^2$+X$_c^2$)$^{1/2}$; θz=θv−θi; and θz=tan$^{-1}$(X$_c$/R).

Where Voltage$_{(ac)}$, Z$_{total}$, and I are phasors; and where Voltage$_{(ac)}$ is the AC line voltage being sensed and/or measured; Z$_{total}$ is the total impedance of the circuit; I is the resulting current being sensed and/or measured; R is the internal resistance; X$_c$ is the total capacitive reactance, i.e., internal and external capacitive reactance of the system; θz is the phase angle difference between the voltage and current waveforms; θv is the phase angle of the voltage waveform; and θi is the phase angle of the current waveform.

As mentioned above, it is known that the current waveform in a purely capacitive AC circuit leads the voltage waveform by ninety degrees (90°). Referring now to FIG. 4B, the computer processor 30 will use a reference digital signal 25 developed by the analog to digital converter 28 that corresponds to the applied voltage and the resulting current flow through the detector circuit 20 when the internal capacitive reactance 16 is in the detector circuit 20, i.e., when the switching means 21 selects the internal capacitive reactance input path 24. When the switching means 21 alternately selects the internal resistance input path 22, the analog to digital converter 28 will develop a comparison digital signal 26, and will send that signal 26 to the computer processor 30. The computer processor 30 will then analyze the differences between the reference digital signal 25 and the comparison digital signal 26. Since the phase angle difference when the internal resistance input path 22 is selected by the switching means 21 will be some angular amount less than ninety degrees (90°), and since the angular amount of the phase angle difference can be determined by the detector circuit 20, the exact value of the external capacitive reactance can be ascertained. Preferably, this can be accomplished by having a data table programmed into the circuitry and/or memory of the computer processor 30. This data table is preferably constructed from field data that corresponds to the exact relationship between various phase angles and/or phase angle differences, and the external capacitive reactance values associated with these various phase angles and/or phase angle differences. The computer processor 30 will be programmed to use this information and will adjust the displayed voltage reading either higher or lower to appropriately compensate for variances in the magnitudes of the external capacitive reactance associated with these phase angle differences for a more accurate voltage measurement reading.

In another embodiment, the computer processor 30 could be programmed to use an algorithm based on an equation, or some other similar mathematical construct, that uses the capacitive coupling of the device based on the distance that the device is suspended above the earth.

Figure 5:
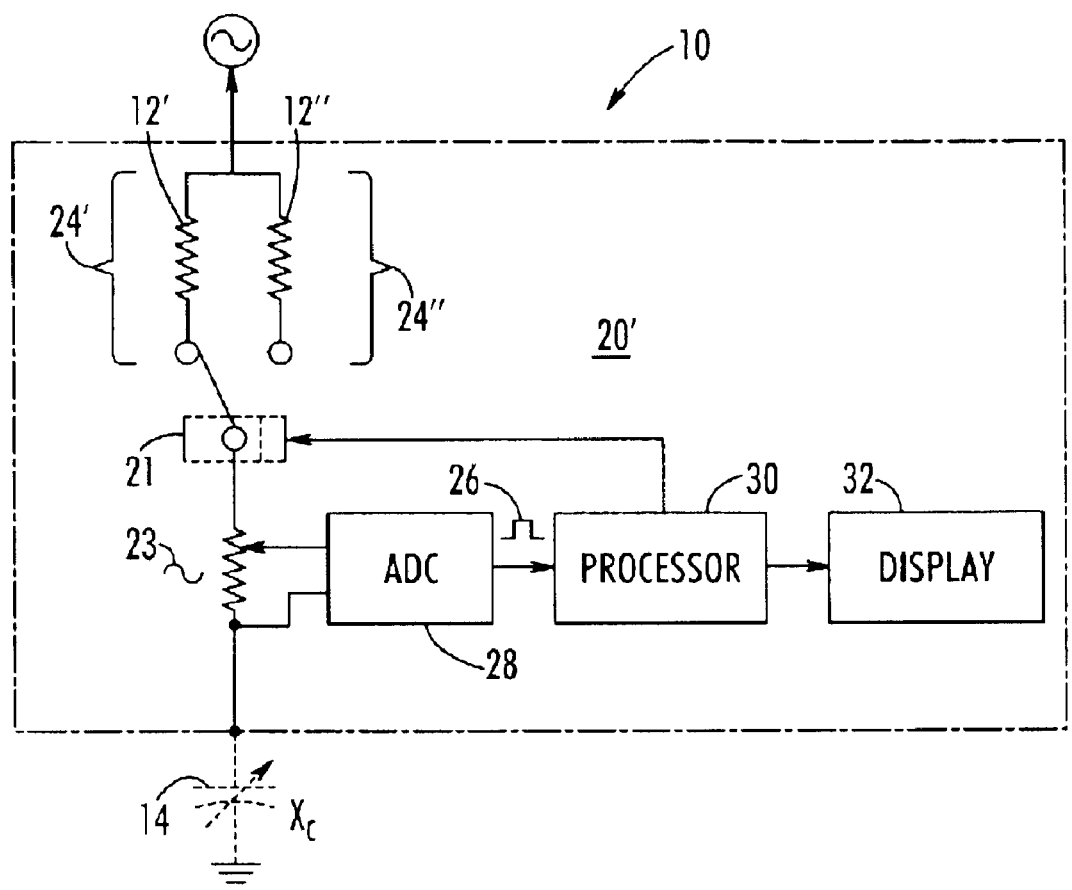
FIG. 5 is a diagram of the detector showing two internal resistance paths, which may have different resistance values, according to another preferred embodiment of the present invention.

The detector 10 and the components and/or devices used in the detector circuit 20 of the present invention are not limited to any specific configuration or design. In this regard, those skilled in the art of AC voltage measuring devices will find that the detector 10 and/or the detector circuit 20 may be configured and/or designed in a variety of similar ways. For example, in another embodiment, as shown in FIG. 5, the detector circuit 20' may substitute another internal resistance input path 24' for the internal resistance input path; therefore, providing two internal resistance input paths 24' and 24". In this embodiment, each resistance input path would be comprised of a known internal resistance 12' and 12", but with the magnitude of each of the resistance differing between the separate resistance input paths 24' and 24". Similarly, two internal resistance input paths comprised of differing resistance magnitudes can be used, as well.

Therefore, while the preferred embodiments and the best mode of the present invention are described herein, it should be understood that the best mode for carrying out the invention as described herein is by way of illustration and not by way of limitation. It is intended that the scope of the present invention includes all modifications that incorporate its principal design features, and that the scope and limitations of the present invention are to be determined by the scope of the appended claims and their equivalents.

What is claimed is:

1. A device for measuring voltage carried by an electrical conductor, said device comprising:

a voltage detector; and a detector circuit in electrical communication with said voltage detector, said voltage detector and said detector circuit having impedance characteristics when said voltage detector and said detector circuit are measuring a voltage carried by an electrical conductor, said detector circuit having alternate internal input paths, means for switching between said alternate internal input paths in order to determine phase differences between voltage and current waveforms of said alternate internal input paths of said voltage detector and said detector circuit when said voltage detector is measuring said voltage, said phase differences being indicative of external capacitive reactance, comparing means for sensing and comparing electrical voltages produced by said voltage detector and said detector circuit when said switching means switches between said alternate internal input paths while said voltage detector and said detector circuit are measuring voltage from an electrical conductor, said comparing means producing an output signal; and computer processor means responsive to said comparing means and receiving said output signal from said comparing means for determining the effect of external capacitive reactance on said voltage measured by said voltage detector and said detector circuit and compensating for the effect of external capacitive reactance on said voltage.

2. The device as recited in claim 1, wherein said alternate internal input paths include an internal resistance path comprised of a resistive component having a known resistance and an internal capacitive reactance input path comprised of a capacitive component having a known capacitance, wherein said voltage signal transmitted from said internal resistance input path is a comparison signal and said voltage signal transmitted from said internal capacitive reactance path is a reference signal.

3. The device as recited in claim 1, wherein said alternate internal input paths are two input paths including a first resistive component having a known first resistance and a second resistive component having a known second resistance, wherein the magnitude of said first resistance differs from the magnitude of said second resistance.

4. The device as recited in claim 2, wherein said means for converting each said analog signal to said digital signal for further signal processing is an analog-to-digital converter; wherein said digital signal derived from said comparison signal is a digital comparison signal and said digital signal derived from said reference signal is a digital reference signal.

5. The device as recited in claim 4, wherein said means for analyzing each said digital signal and for transmitting said measurement signal is a computer processor; wherein said computer processor receives said digital reference signal developed and transmitted by said analog-to-digital converter corresponding to the applied voltage and the resulting current flow through said detector circuit when said internal capacitive reactance is in said detector circuit due to said switching means selecting said internal capacitive reactance input path, and wherein, when said switching means alternatively selects said internal resistance input path, said analog-to-digital converter develops said digital comparison signal and transmits said digital comparison signal to said computer processor, wherein said computer processor analyzes the differences between said digital reference signal and said digital comparison signal, compensates for external capacitive reactance effects based on this analysis and transmits said measurement signal to said means for receiving and visually displaying.

6. The device as recited in claim 5, wherein said computer processor further comprises a data table, said data table programmed into and stored within said computer processor, said data table comprising a known set of phase angle values and their corresponding external capacitive reactance values, wherein, when said computer processor analyzes the differences between said digital reference and said digital comparison signals, said computer processor determines an external capacitive reactance value and compensates for said external capacitive reactance value prior to transmitting said measurement signal to said receiving and displaying means.

7. The device as recited in claim 1, wherein said comparing means includes an analog-to-digital converter.

8. The device as recited in claim 7, wherein said analog-to-digital converter is a high speed analog-to-digital converter.

9. The device as recited in claim 1, wherein said computer processor means determines the external capacitive reactance from a data table of stored capacitive reactances as a function of phase difference, said data table carried by said computer processor.

* * * * *